(12) United States Patent
Kobayashi et al.

(10) Patent No.: US 10,591,566 B2
(45) Date of Patent: Mar. 17, 2020

(54) SYSTEMS AND METHODS FOR STEADY-STATE ECHO MAGNETIC RESONANCE IMAGING

(71) Applicant: REGENTS OF THE UNIVERSITY OF MINNESOTA, Minneapolis, MN (US)

(72) Inventors: Naoharu Kobayashi, Minneapolis, MN (US); Djaudat Idiyatullin, Minneapolis, MN (US); Michael Garwood, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 16/341,677

(22) PCT Filed: Oct. 13, 2017

(86) PCT No.: PCT/US2017/056487
§ 371 (c)(1),
(2) Date: Apr. 12, 2019

(87) PCT Pub. No.: WO2018/071754
PCT Pub. Date: Apr. 19, 2018

(65) Prior Publication Data
US 2019/0369193 A1 Dec. 5, 2019

Related U.S. Application Data

(60) Provisional application No. 62/407,609, filed on Oct. 13, 2016.

(51) Int. Cl.
*G01R 33/56* (2006.01)
*G01R 33/561* (2006.01)
(Continued)

(52) U.S. Cl.
CPC ....... *G01R 33/5613* (2013.01); *G01R 33/243* (2013.01); *G01R 33/56563* (2013.01)

(58) Field of Classification Search
CPC .......... G01R 33/5613; G01R 33/56563; G01R 33/243; G01R 33/5614
See application file for complete search history.

(56) References Cited

U.S. PATENT DOCUMENTS 7,116,105 B1 10/2006 Zhang
2015/0002149 A1* 1/2015 Nehrke ................ G01R 33/243
324/309

OTHER PUBLICATIONS

International Search Report and Written Opinion for international application No. PCT/US2017/056487 dated Feb. 1, 2018, 15 pages.

(Continued)

*Primary Examiner* — Rishi R Patel
(74) *Attorney, Agent, or Firm* — Quarles & Brady LLP

(57) ABSTRACT

A method for acquiring magnetic resonance imaging data from a subject. The method includes performing a series of radio frequency pulses formed of individual RF pulses applied with a constant time interval between each of the individual RF pulses to form a consistent magnetic field about at least of a region of interest in the subject, where the RF pulse has a flip angle of less than 30 degrees. The method also includes performing phase encoding gradients to achieve spatial encoding and performing an imaging acquisition process over an acquisition window to acquire imaging data. The method further includes performing phase encoding rephasing gradients and repeating the preceding steps such that a time between a center of the acquisition window and a center of a first RF pulse in a first RF pulse in a repetition of the RF pulses is equal to the constant pulse interval.

13 Claims, 8 Drawing Sheets

(51) Int. Cl.
*G01R 33/565* (2006.01)
*G01R 33/24* (2006.01)

(56) References Cited

OTHER PUBLICATIONS

Werthner et al., Cosess and Insess: Coherent and Incoherent Spin Echoes in the Steady State, Magnetic Resonance in Medicine, Aug. 1996, vol. 36, No. 2, pp. 294-305, 12 pages.
Patz et al., Missing Pulse Steady-State Free Precession, Magnetic Resonance in Medicine, May 1989, vol. 10, No. 2, pp. 194-209, 16 pages.
Kobayashi et al., Magnetic Resonance Imaging under Highly Onhomogeneous B0 Fields using Missing-Pulse Steady-State Free Precession (MP-SSFP), Proceedings of the International Society for Magnetic Resonance in Medicine, 25th Annual Meeting & Exhibition, No. 5052, Apr. 7, 2017, 3 pages.
Kobayashi et al., B0 mapping of Highly Inhomogeneous Fields using Missing-Pulse Steady-State Free Precession (MP-SSFP), Proceedings of the International Society for Magnetic Resonance in Medicine, 25th Annual Meeting & Exhibition, No. 3973, Apr. 7, 2017, 3 pages.
Dreher et al., Fast Three-Dimensional Proton Spectroscopic Imaging of the Human Brain at 3 T by Combining Spectroscopic Missing Pulse Steady-state Free Precession and Echo Planar Spectroscopic Imaging, Magnetic Resonance in Medicine, vol. 66, No. 6, May 13, 2011, pp. 1518-1525, 8 pages.

\* cited by examiner

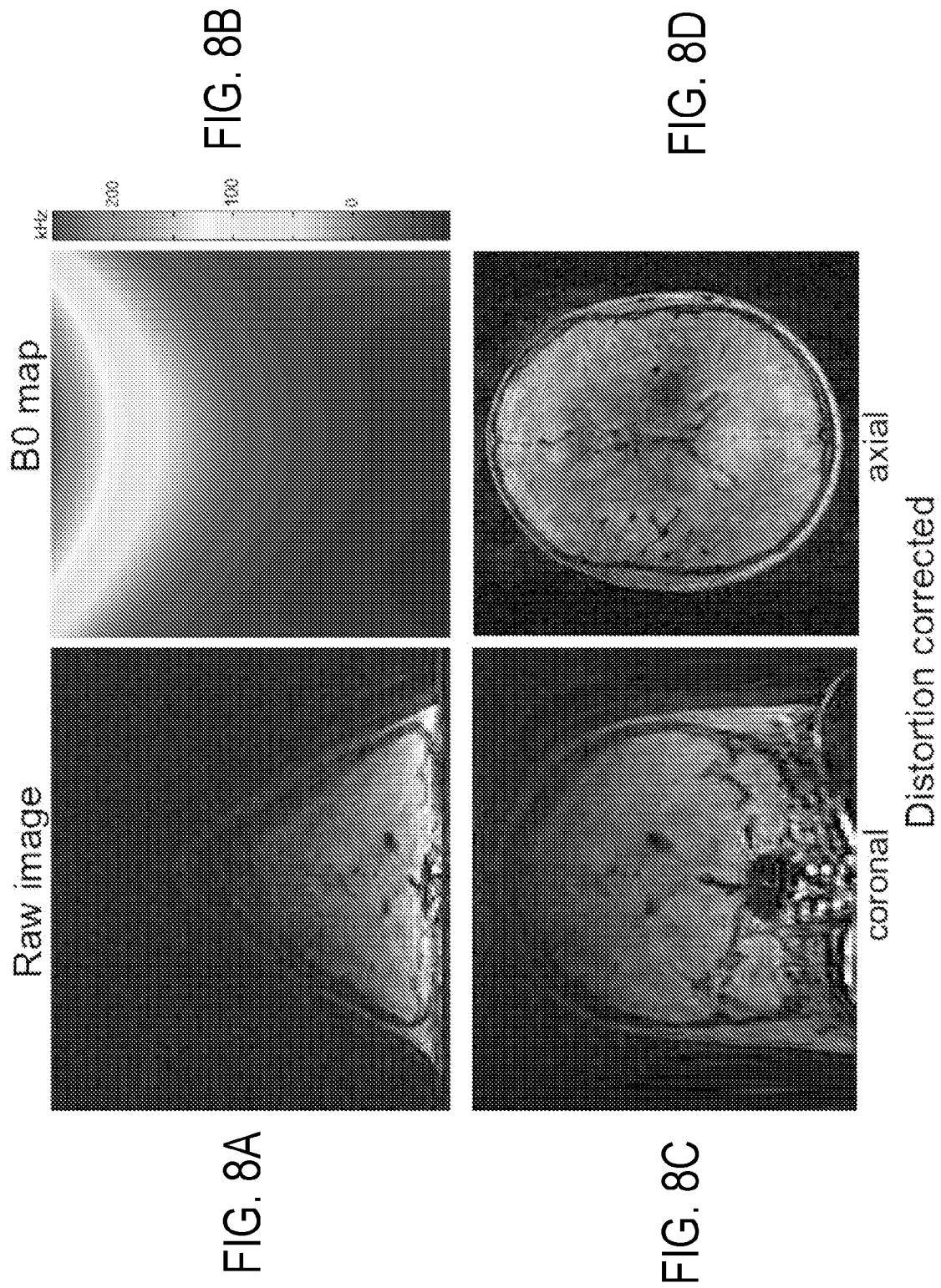

SYSTEMS AND METHODS FOR STEADY-STATE ECHO MAGNETIC RESONANCE IMAGING

CROSS REFERENCE TO RELATED APPLICATIONS

This application is a U.S. National Stage of PCT Application No. PCT/US2017/056487 filed on Oct. 13, 2017 which is based on, claims priority to, and incorporates herein by reference in its entirety, U.S. Provisional Application Ser. No. 62/407,609, filed Oct. 13, 2016.

STATEMENT REGARDING FEDERALLY SPONSORED RESEARCH

This invention was made with government support under EB015894, MH105998, RR023730, and RR027290 by the National Institutes of Health. The government has certain rights in the invention.

BACKGROUND

When a substance such as human tissue is subjected to a uniform magnetic field (polarizing field $B_0$), the individual magnetic moments of the nuclear spins in the tissue tend to align with this polarizing field. If they are not initially aligned precisely with the polarizing field, they will precess about the field at their characteristic Larmor frequency as a top precesses about the Earth's gravitational field if the top's spin axis is not initially aligned with the field. Leveraging these fundamentals of physics, the nuclear spins of the nuclei of the highly-prevalent hydrogen atom are often targeted to investigate substances, such as through imaging, spectroscopy, or other analysis techniques. However, active nuclei of other elements are occasionally used in various applications.

Regardless of the particular nuclei being targeted, at equilibrium, the individual magnetic moments of all the nuclei combine to produce a net magnetic moment M in the direction of the polarizing field (maximizing Mz component). If the substance is subjected to a magnetic field (excitation field $B_1$; also referred to as the radiofrequency (RF) field) that is in the x-y plane and that oscillates near the Larmor frequency, the net aligned moment, M, may be rotated, or "tipped", into the x-y plane to produce a net transverse magnetic moment $M_{xy}$, which precesses (rotates about the $B_0$ field direction) in the x-y plane at the Larmor frequency. The typically-brief application of the $B_1$ field that accomplishes the tipping of the nuclear spins is generally known as an "RF pulse." The practical value of this phenomenon resides in the signal that is emitted by the excited spins after the excitation field $B_1$ is terminated. There is a wide variety of measurement pulse sequences ("sequences") in which this NMR phenomenon is exploited for imaging, spectroscopy, and other application.

Under highly inhomogeneous static magnetic fields, MRI has fundamental difficulties in both signal excitation and data acquisition. For example, the inhomogeneous magnetic field spreads the frequency distribution of spin signals to the wide frequency range, which makes it difficult to excite all spins in the field of view (FOV) using conventional radiofrequency (RF) pulses. Moreover, the inhomogeneous field is permanently on and thus cannot be reversed as with pulsed gradient fields. Therefore, MRI under inhomogeneous fields usually relies on spin echo signals because the spin echo sequence refocuses the spin dephasing caused by field inhomogeneity. However, use of a refocusing RF pulse with a higher flip angle for spin echo formation is not feasible in MRI on human subjects with inhomogeneous fields, since it also needs to cover the wide frequency range of spin isochromats; that may require impractically high RF peak power and specific absorption rate (SAR).

Additionally, increased access to MRI scanning can occur if the cost of the MRI system can substantially decrease. One approach to achieve this is to decrease the size of MRI magnets, but this comes at a cost of drastically reduced static field ($B_0$) homogeneity, which can easily lead to >100 kHz off-resonance variation.

Thus, a need continues for systems and methods for performing clinical MRI in the face of inhomogeneous static magnetic fields.

SUMMARY

The present disclosure overcomes the aforementioned drawback by providing a system and method for MRI that can be used under substantially inhomogeneous magnetic fields (e.g., in frequency unit of at least 250 kHz for protons), that does not use explicit refocusing RF pulses. The systems and methods utilize RF pulse trains for signal excitation and acquire refocusing steady-state echoes generated by the RF pulse train.

In one aspect of the disclosure, a method is provided for acquiring magnetic resonance imaging data from a subject. The method includes performing a series of radio frequency pulses formed of L individual RF pulses ($P_j$; j=1, 2, . . . L) applied with a constant time interval, $\tau$, between each of the L individual RF pulses to form a consistent $B_1$ magnetic field about at least of a region of interest (ROI) in the subject. The L individual RF pulses are applied at a flip angle of less than 30 degrees. The method also includes performing phase encoding gradients to achieve spatial encoding and performing an imaging acquisition process over an acquisition window (Acq) following the phase encoding gradients to acquire imaging data. The method further includes performing phase encoding rephasing gradients to rewind spins introduced by the phase encoding gradients and repeating the preceding steps such that a time between a center of the acquisition window (Acq) and a center of a first RF pulse in a first RF pulse in a repetition of the RF pulses is equal to the constant pulse interval ($\tau$).

In another aspect of the disclosure, a magnetic resonance imaging (MRI) system is provided that includes a magnet system configured to generate a polarizing magnetic field about at least a region of interest (ROI) of a subject arranged in the MRI system, wherein the polarizing magnetic field is inhomogeneous within the ROI. The MRI system also includes a plurality of gradient coils configured to apply a gradient field to the polarizing magnetic field and a radio frequency (RF) system configured to apply an excitation field to the subject and acquire MR image data from the ROI. The MRI system further includes a computer system programmed to control the plurality of gradient coils and the RF system to (i) perform a series of radio frequency pulses formed of L individual RF pulses ($P_j$; j=1, 2, . . . L) applied with a constant time interval, $\tau$, between each of the L individual RF pulses to form a consistent $B_1$ magnetic field about at least of the ROI. The L individual RF pulses are applied at a flip angle of less than 30 degrees. The computer system is further configured to (ii) perform phase encoding gradients to achieve spatial encoding and (iii) perform an imaging acquisition process over an acquisition window (Acq) following the phase encoding gradients to acquire imaging data. The computer system is also configured to (iv) perform phase encoding rephasing gradients to rewind spins introduced by the phase encoding gradients and (v) repeat steps (i)-(iv) such that a time between a center of the acquisition window (Acq) and a center of a first RF pulse in a first RF pulse in a repetition of (i) is equal to the constant pulse interval ($\tau$). The computer system is also configured to (vi) generate images of the ROI that are substantially free of artifacts caused by inhomogeneities of the polarizing magnetic field.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DESCRIPTION OF DRAWINGS

The invention will be better understood and features, aspects and advantages other than those set forth above will become apparent when consideration is given to the following detailed description thereof. Such detailed description makes reference to the following drawings

FIG. 8A is raw image acquired with a head gradient of approximately 36 cm outside of magnet center in the 4 T scanner, which generates roughly 250 kHz off-resonance frequency variation within 25 cm. 250 kHz is ~1500 ppm at 4 T.

FIG. 8B is a $B_0$ map created for the $B_0$ field used when acquiring the raw image of FIG. 8B.

FIG. 8C is a distortion corrected coronal image, wherein the deformation matrix was calculated from the $B_0$ map of FIG. 8B.

FIG. 8D is a distortion corrected axial image, wherein the deformation matrix was calculated from the $B_0$ map of FIG. 8B.

DETAILED DESCRIPTION

Figure 1:
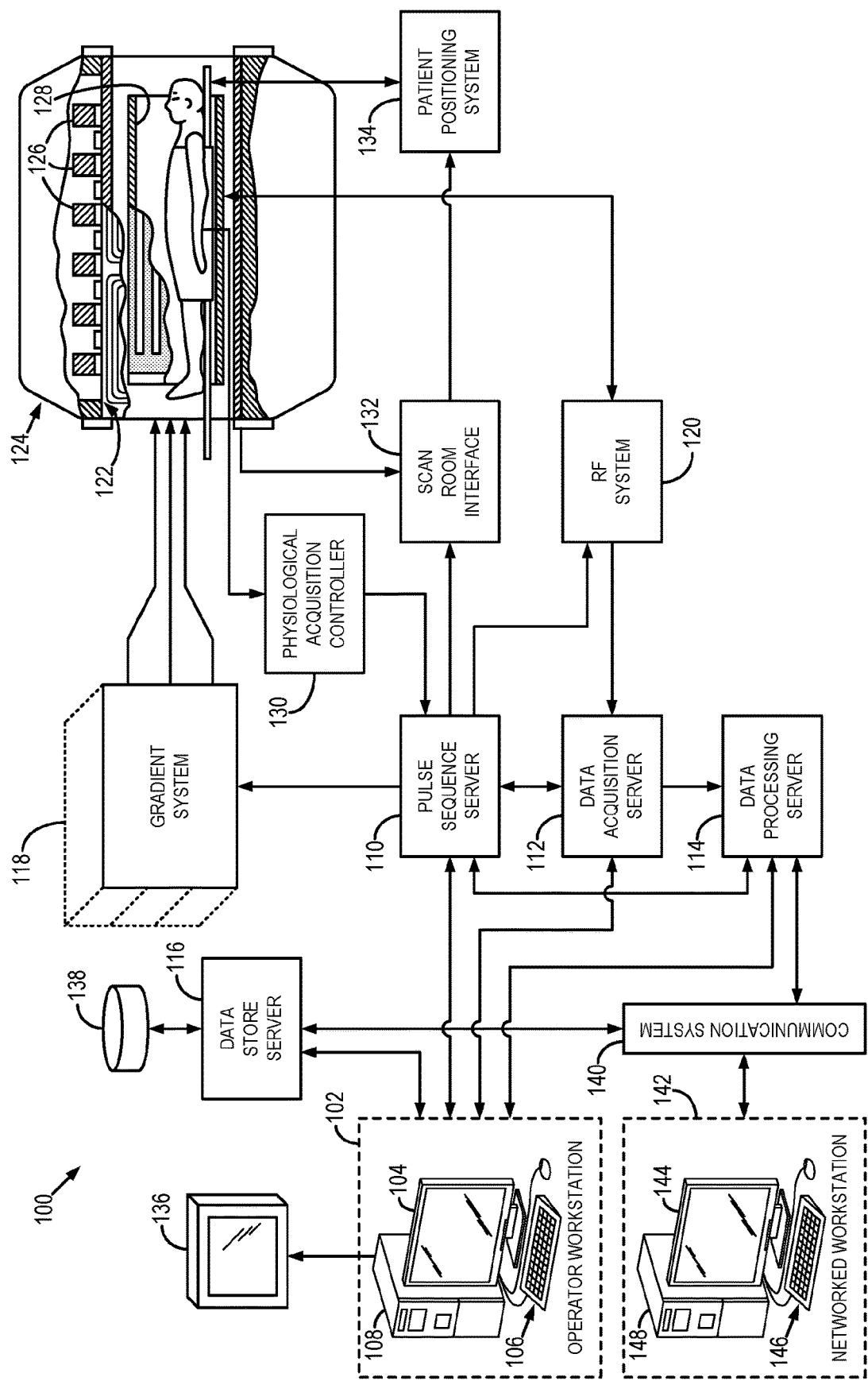
FIG. 1 is a schematic diagram of an MRI system configured in accordance with the present disclosure.

Referring particularly now to FIG. 1, an example of an MRI system 100 that can implement the methods described here is illustrated. The MRI system 100 includes an operator workstation 102 that may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MRI system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (1);$$

and the phase of the received magnetic resonance signal may also be determined according to the following relationship:

$$\varphi = \tan^{-1}\left(\frac{Q}{I}\right). \qquad (2)$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MRI system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

Currently, standard MRI systems require highly homogenous magnetic fields, in which the Larmor frequency variation is on the order of only one or two hundred hertz. Under highly inhomogeneous static magnetic fields, MRI has fundamental difficulties in both signal excitation and data acquisition. For example, the inhomogeneous magnetic field spreads the frequency distribution of spin signals to the wide frequency range, which makes it difficult to excite all spins in the field of view (FOV) using conventional radiofrequency (RF) pulses. Moreover, the inhomogeneous field is permanently on and thus cannot be reversed as with pulsed gradient fields. Therefore, MRI under inhomogeneous fields usually relies on spin echo signals because the spin echo sequence refocuses the spin dephasing caused by field inhomogeneity. However, use of a refocusing RF pulse with a higher flip angle for spin echo formation is not feasible in MRI on human subjects with inhomogeneous fields, since it also needs to cover the wide frequency range of spin isochromats; that may require impractically high RF peak power and specific absorption rate (SAR).

Figure 2:
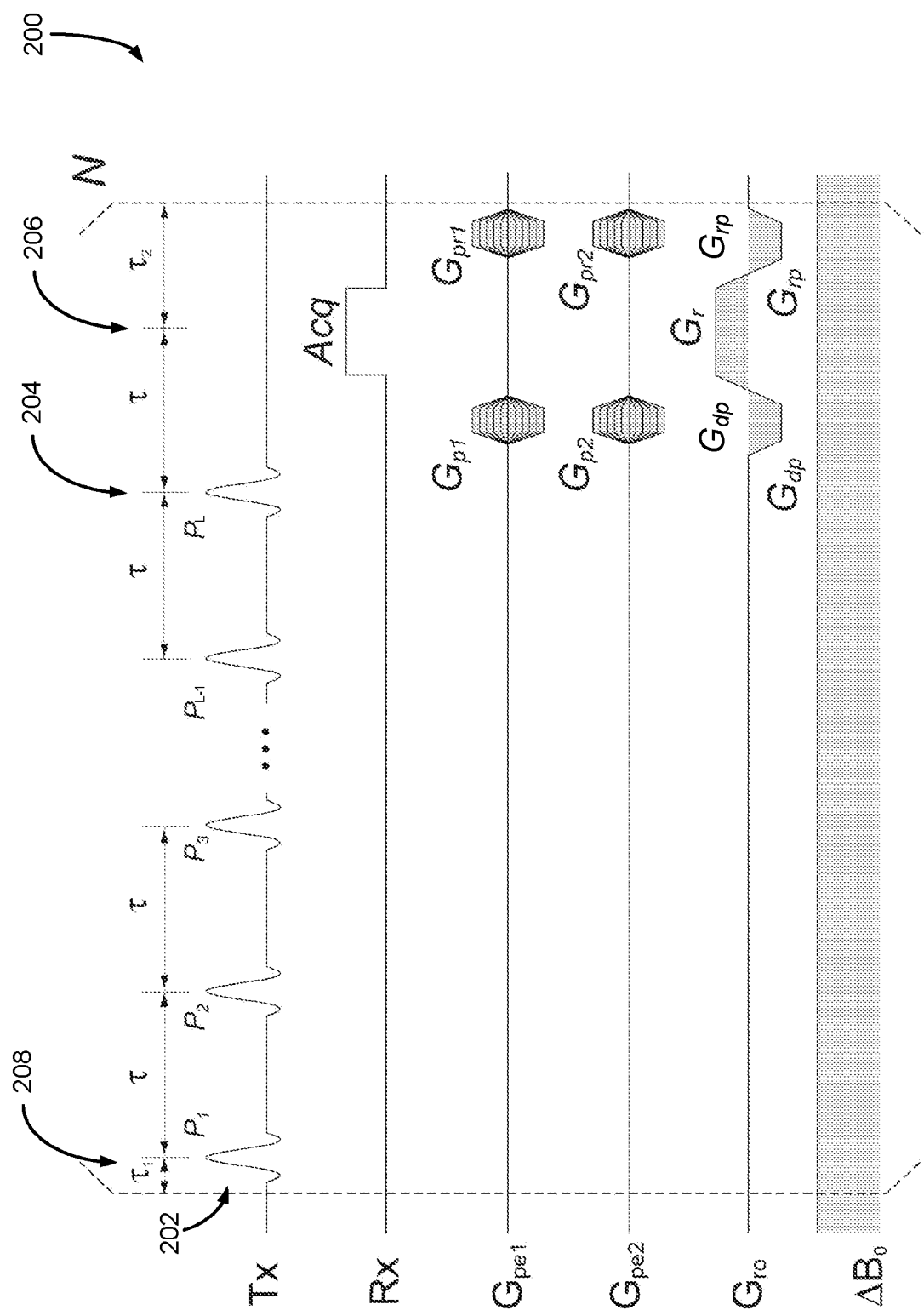
FIG. 2 is a pulse sequence diagram of an RF pulse train excitation sequence in accordance with the present disclosure.

To overcome these difficulties, one non-limiting example of a pulse sequence in accordance with the present disclosure is illustrated in FIG. 2. In general, the pulse sequence does not use explicit refocusing RF pulses, but rather uses a train of RF pulses for signal excitation and acquires refocusing echoes generated by the RF pulse train excitation. The pulse sequence is capable of producing quality images under a permanent or polarizing $B_0$ field inhomogeneity in frequency unit of at least 250 kHz for protons.

In the illustrated pulse sequence 200, spin magnetization can be excited with an RF pulse train 202 under a spatially inhomogeneous magnetic field $\Delta B_0$ ($=B_0-\omega_0/\gamma$, where $\omega_0$ and $\gamma$ are the carrier frequency and gyromagnetic ratio, respectively). In the RF pulse train 202, L individual RF pulses ($P_j$; j=1, 2, . . . L) are applied with a constant time interval, $\tau$. The waveform of the RF pulses ($P_j$; j=1, 2, . . . L) in the pulse train 202 can be an amplitude modulated pulse (e.g., hard, sinc, and Gaussian pulses) or a frequency-modulated pulse (e.g., Chirp and hyperbolic secant pulses). Each of the RF pulses ($P_j$; j=1, 2, . . . L) in the train 202 may have a common waveform and pulse duration (pw), but the flip angle ($\alpha_j$) and phase ($p_j$) can be set arbitrarily. The excitation bandwidth (BW) of the RF pulse train ($P_j$; j=1, 2, . . . L) depends on the bandwidth of each pulse ($P_j$; j=1, 2, . . . L) in the pulse train 202. For example, the excitation bandwidth (BW) of the RF pulse train ($P_j$; j=1, 2, . . . L) may match the bandwidth of each pulse in the pulse train. After the RF pulse train 202, signal acquisition (Acq) is carried out following pulsed phase encoding gradients ($G_{p1}$ and $G_{p2}$), which are applied to achieve spatial encoding.

Thus, as will be described, an RF pulse train 202 of frequency swept RF pulses can be used with relatively small flip angles ($\alpha_j$), for example, between 0 degrees to 30 degrees and, more likely between 0.5 degrees and 15 degrees. In other aspects, the flip angle of the RF pulse is 1 degree, or 2 degrees, or 3 degrees, or 4 degrees, or 5 degrees, or 6 degrees, or 7 degrees, or 8 degrees, or 9 degrees, or 10 degrees, or 11 degrees, or 12 degrees or 13 degrees, or 14 degrees. Achievable flip angle is dependent on the static magnetic field strength and the field inhomogeneity (i.e.

excitation bandwidth). To avoid excessively strong diffusion weighting in the presence of highly inhomogeneous magnetic fields, which limits available flip angles due to increases of RF peak power and SAR, the constant pulse interval ($\tau$) can be applied in short intervals, for example, between 2 milliseconds and 15 milliseconds. The frequency swept RF pulses can achieve broad excitation bandwidths between 1 kHz and 1000 kHz with pulse duration between 0.2 millisecond and 10 millisecond to cover the wide frequency distribution associated with the inhomogeneous magnetic field. In some aspects, the excitation bandwidth (BW) may range from 50 kHz to 250 kHz. For example, the excitation bandwidth (BW) can be 60 kHz, 70 kHz, 80 kHz, 90 kHz, 100 kHz, 110 kHz, 120 kHz, 130 kHz, 140 kHz, 150 kHz, 160 kHz, 170 kHz, 180 kHz, 190 kHz, 200 kHz, 210 kHz, 220 kHz, 230 kHz, or 240 kHz.

This stands in stark contrast to traditional pulse sequences that are relied upon in the face of static magnetic field inhomogeneities, such as spin echo-based pulse sequences, that use 90 or 180 degree excitation pulses with high bandwidth ($\geq 3$ kHz). This is because the use of pulse sequences with high bandwidth and with large flip angles ($\alpha_j$) are limited, for example, due to SAR constraints. Furthermore, the RF pulse train 202 of frequency swept RF pulses can be used with relatively small flip angles also overcomes challenges with potential signal loss because the coherence pathways come back, leading to desirable SNR, even with low flip angles. Additionally or alternatively, the above-described pulse sequence can be used with a single-sided NMR probe to perform volumetric imaging, for example, such as is available as the "minispec ProFiler" from Bruker.

During signal acquisition (Acq), a pulsed readout gradient field ($G_r$) along with dephasing ($G_{dp}$) and rephasing ($G_{rp}$) gradients before and after the readout gradient ($G_r$) can be optionally applied. For example, the inhomogeneous magnetic field ($B_0$) can be partly compensated for with the pulsed readout gradient ($G_r$). Moreover, when there are regions with a local field gradient ($\nabla B_0 = 0$) or there are more than one spatial locations with a single magnetic field strength along the direction, z, perpendicular to the phase encoding directions $B_0(x, y, z_1) = B_0(x, y, z_2)$, $z_1 \neq z_2$, the spatial information cannot be resolved in the critical regions. The pulsed readout gradient ($G_r$) can be applied to avoid the singularity (i.e., all regions inside of FOV satisfy $\nabla B_0 \neq 0$ and $B_0(x, y, z_1) \neq B_0(x, y, z_2)$). Time between the center of the last RF pulse 204 in the pulse train 202 and the center 206 of the signal acquisition window (Acq) is the same as the pulse interval ($\tau$) in the excitation pulse train 202.

Following the signal acquisition, phase encode rephasing gradients ($G_{pr1}$, and $G_{pr2}$) are applied to rewind the spin phase introduced by the phase encoding gradients ($G_{p1}$ and $G_{p2}$). That is, the phase encode rephasing gradients serve the function of a rewinder applied with reverse polarity to insure stability of the phase of the MR signal in each repetition. Time between the center of the acquisition window (Acq) and the center of the first RF pulse in the following excitation pulse train 208 is equal to the pulse interval ($\tau$) in the excitation pulse train 202 (i.e., $\tau_1 + \tau_2 = \tau$ in FIG. 2). Therefore, the pulse sequence 200 is a pulse train composed of L+1 RF pulses with a constant interval ($\tau$), where the L+1th pulse is replaced with data acquisition. Multiple echo acquisition can be conducted by replacing more than one RF pulses with data acquisitions along with phase encoding and rewinding gradients (e.g., 2 echo acquisition by replacing the L−3th and L+1th RF pulses, L>3). Either way, the $B_1$ field produced by the pulse train 202 is consistent and is sufficient to overcome inconsistencies in the $B_0$ field, such as even highly inhomogeneous static magnetic fields. The pulse sequence 200 has a form that is somewhat similar to a missing pulse steady-state free precession (MP-SSFP) pulse sequence. However, as will be described, unlike an MP-SSFP pulse sequence, the pulse sequence 200 is specifically designed to yield robust data in the face of B0 inhomogeneity, while controlling SAR and RF peak power to be clinically feasible.

Generally, L has a value of at least 2, such that echoes refocus at the center of the acquisition window. That is, if L has a value of 1, then no echo refocuses. When the constant interval ($\tau$) is changed to not be a constant value, peaks of the refocusing echoes do not align at a single time, which results in artifacts in reconstructed images.

The pulse sequence 202 can be repeated N times to acquire refocusing echo signals $S_i$ (i=1, 2, ..., N) sufficient for 3D image reconstruction by changing the phase encoding gradients ($G_{p1}$ and $G_{p2}$). For example, when the phase encoding gradients ($G_{p1}$ and $G_{p2}$) are mutually orthogonal linear gradients in space and applied with constant increments, the number of repetitions N is represented by $N=N_{pe1} \times N_{pe2}$, in which $N_{pe1}$ and $N_{pe2}$ are the number of phase encoding steps along the 2 phase encoding directions. The pulsed readout gradient ($G_r$) and the phase encoding gradients ($G_{p1}$ and $G_{p2}$) can be spatially nonlinear gradients. The increments of phase encoding gradients can be arbitrary.

Figure 3:
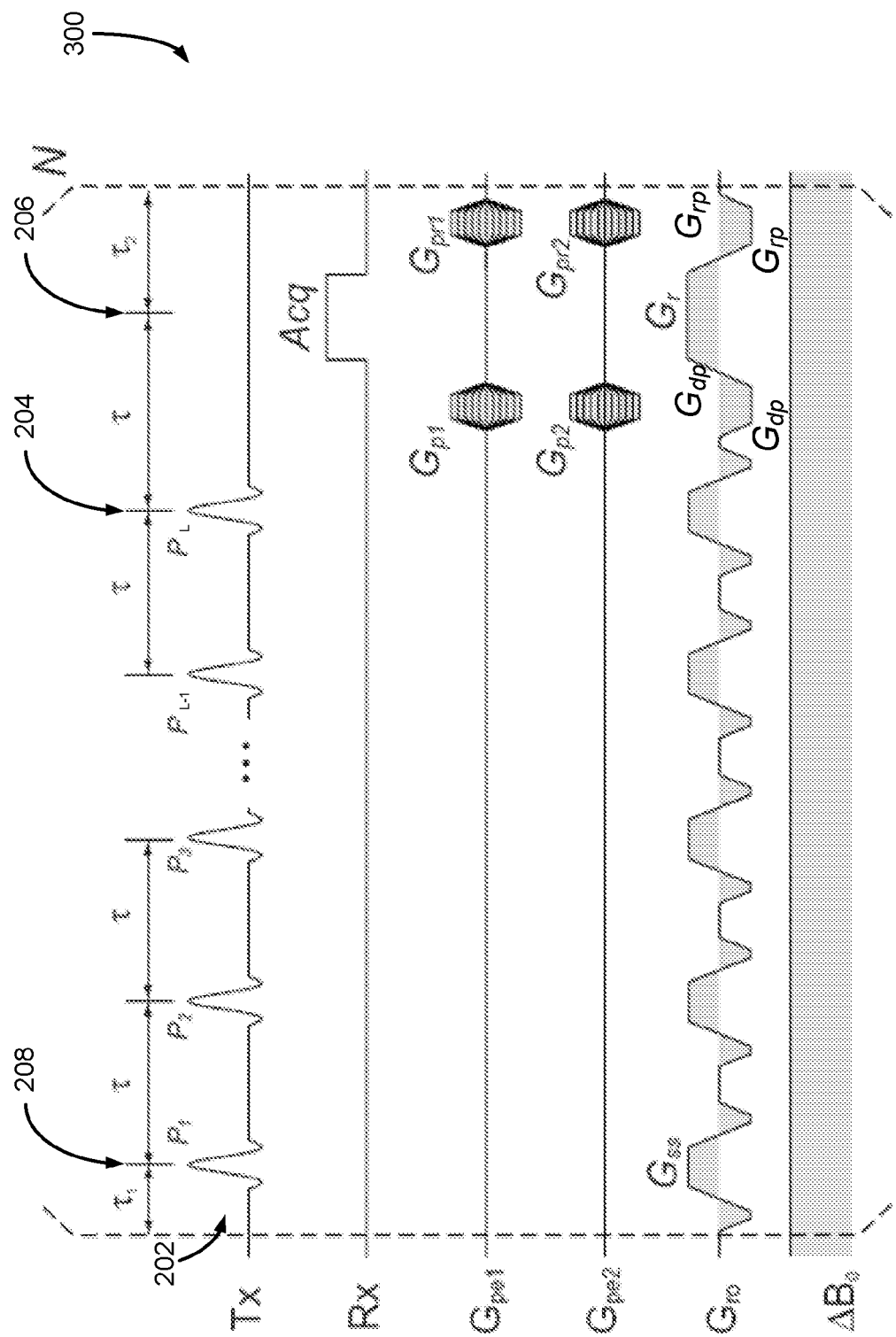
FIG. 3 is a pulse sequence diagram of an RF pulse train excitation sequence in accordance with the present disclosure

Referring to FIG. 3, another non-limiting example of a pulse sequence 300 in accordance with the present disclosure is illustrated. The pulse sequence 300 includes many similar features described above. However, pulse sequence 300 includes a pulsed slab-selective gradient ($G_{ss}$) that is applied to mitigate a portion of the $B_0$ inhomogeneity.

RF pulse train excitation or refocusing has been employed in, for example, steady-state free precession (SSFP) and turbo spin echo (TSE) with low flip angle ($\alpha_j$) refocusing pulses. SSFP acquires the similar steady-state magnetization with gradient echoes generated by applying pulsed readout gradients. However, since gradient echo formation is challenging under highly inhomogeneous static fields ($B_0$), SSFP will fail in the face of inhomogeneous static magnetic fields ($B_0$). Additionally, SSFP is highly sensitive to off-resonance due to gradient echo formation in overlapped dephasing and refocusing echo tails, which results in well-known banding artifacts.

TSE with low flip angle ($\alpha_j$) refocusing pulses may work under inhomogeneous static fields ($B_0$) when it is performed as 3D imaging. However, TSE has some practical limitations that limit utility. All refocusing echoes used in the TSE sequence originate from the transverse magnetization generated by the initial excitation pulse. Therefore, it needs relatively high flip angle ($\alpha_j$) excitation to achieve sufficient signal-to-noise ratio, which is difficult under highly inhomogeneous static fields ($B_0$). Moreover, the refocusing echo signals derived from the initial excitation decrease as it reaches the latter echoes due to relaxation. The magnetization reaches the same steady-state as SSFP in the latter echoes, which indicates it is difficult to capture signals at the steady-state.

$B_0$ Mapping of the Highly Inhomogeneous Field With the RF Pulse Train Excitation Sequence In addition to providing a consistent means of providing clincal-quality images in the face of inhomogenous and even highly inhomogenous static magnetic fields, the above-described pulse sequences 200 or 300 can be used for $B_0$ field mapping under highly inhomogeneous static fields by applying one more phase encoding gradient along the readout dimension, i.e. three phase encoding gradients.

Figure 4:
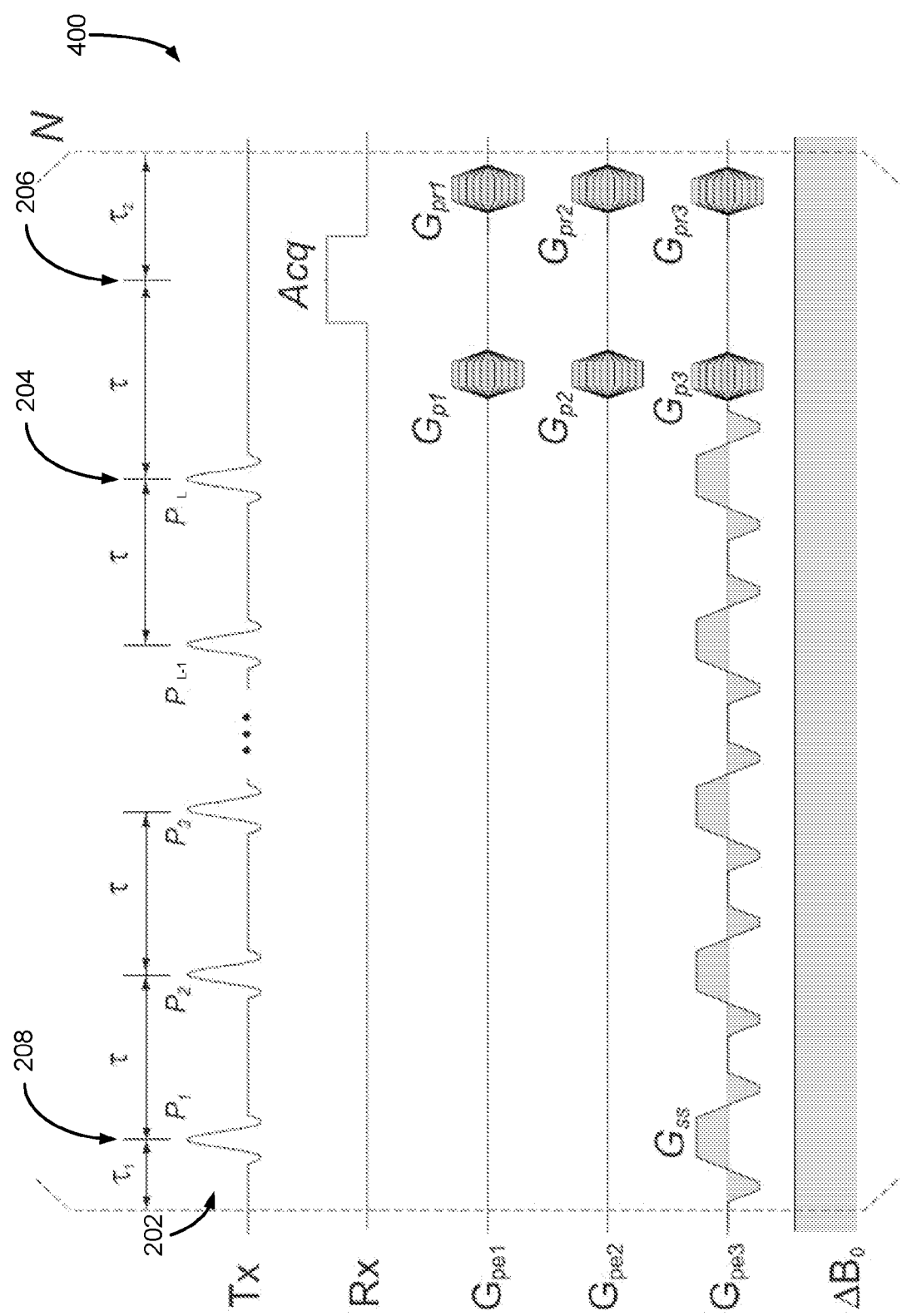
FIG. 4 is a pulse sequence diagram of an RF pulse train excitation sequence in accordance with the present disclosure

For example, FIG. 4 illustrates one non-limiting example of a pulse sequence 400. The pulse sequence 400 includes similar features as described above. That is, pulse sequence 400 includes an RF pulse train 202 formed of L individual RF pulses ($P_j$; j=1, 2, . . . L) applied with a constant time interval, $\tau$. Following the RF pulse train 202, pulsed phase encoding gradients ($G_{p1}$, $G_{p2}$, and $G_{p3}$) are applied to achieve spatial encoding. Signal acquisition (Acq) is carried out during a missing pulse, i.e. at L+1 RF pulses. At this point, echoes consisting of overlapping spin and stimulated echoes refocus at the missing pulse regardless of field inhomogeneity. Spin isochromats refocus toward the echo peak timing, $t_{echo}$, and then dephase after the echo peak. Following the signal acquisition, phase encode rephasing gradients ($G_{pr1}$, $G_{pr2}$, and $G_{pr3}$) are applied to rewind the spin phase introduced by the phase encoding gradients ($G_{p1}$, $G_{p2}$, and $G_{p3}$). Time between the center of the acquisition window (Acq) and the center of the first RF pulse in the following excitation pulse train 208 is equal to the pulse interval ($\tau$) in the excitation pulse train 202 (i.e., $\tau_1+\tau_2=\tau$ in FIG. 4). During excitation, a pulsed slab-selective gradient ($G_{ss}$) may optionally be applied to mitigate a portion of the $B_0$ inhomogeneity, similar to FIG. 3.

Due to the additional phase encoding gradient data acquisition is 4-dimensional (3 spatial dimensions with phase encoding and 1 time/spectral dimension). A $B_0$ field map, $B_0$ [Hz], is measured by picking up two 3D images ($I_1$ and $I_2$) at different time points around $t_{echo}$ ($t_1$ and $t_2$, $t_1<t_2$) and calculating the following equation:

$$B_0=(\arg(I_2)-\arg(I_1))/(2\pi\cdot(t_2-t_1)) \qquad (3).$$

In this case, $t_1$ and $t_2$ are independent of the constant RF pulse interval ($\tau$) described above with respect to FIGS. 2-3. More particularly, $t_1$ and $t_2$ are time points relative to the refocusing echo peak. For example, $t_1$ is the time at the peak and $t_2$ is $t_1$+dw. where dw is the length of time used to acquire one data point, also known as dwell time.

The $B_0$ field map can then be used to correct three-dimensional (3D) image data by calculating an image distortion field based on the $B_0$ field map. Signal intensities may also be corrected using the Jacobian of the image distortion field. Image reconstruction is then performed as would be readily understood by those skilled in the art. For example, using routine written code with C++ and image distortion and intensity correction using Insight Toolkit (ITK).

Refocusing Echoes Generated by the RF Pulse Train Excitation Sequence

Figure 5:
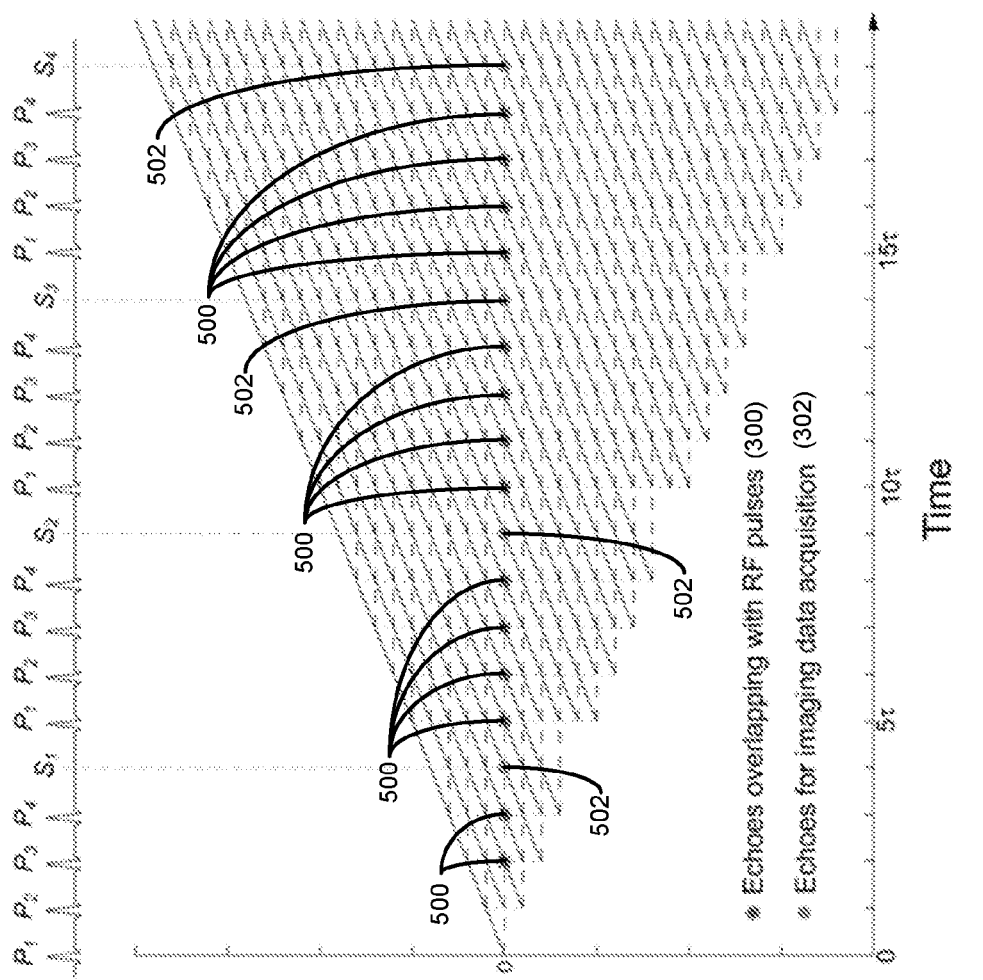
FIG. 5 is a phase graph of the RF pulse train excitation sequence of FIG. 2.
Figure 6:
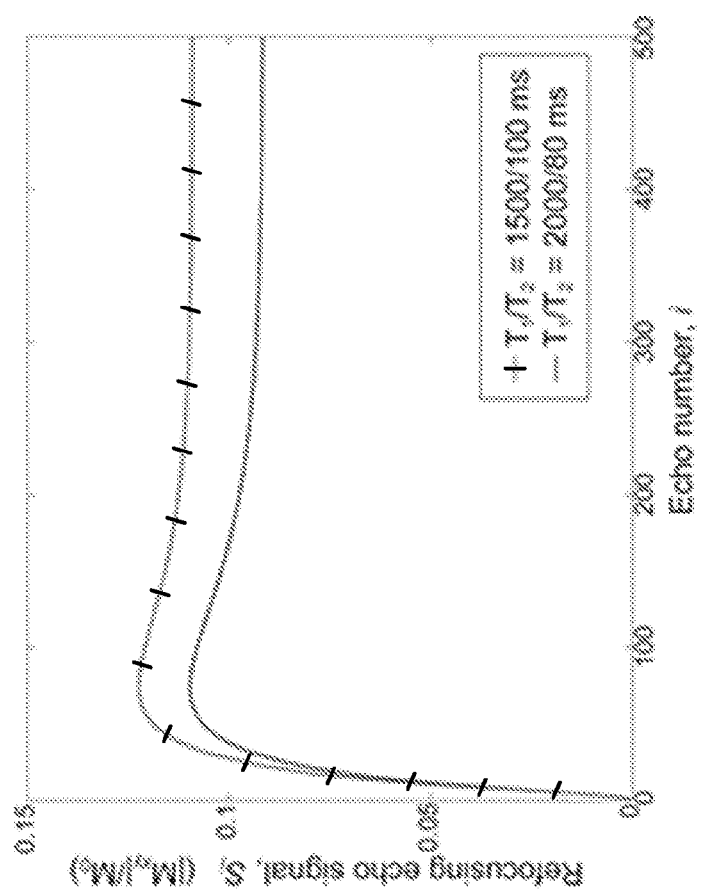
FIG. 6 shows a signal intensity of the refocusing echoes acquired for imaging using the pulse sequence of FIG. 2.

A phase graph of spin magnetization in the RF pulse train excitation sequence 200, 300, or 400 is shown in FIG. 5. In this non-limiting example, the number of RF pulses 500 in each excitation pulse train L is 4 and one echo 502 is acquired after each excitation pulse train 500. The RF pulse train 500 generates refocusing echoes with a constant interval, $\tau$, which are an overlap of a spin echo, a stimulated echo, and higher order echoes. The refocusing echoes of FIGS. 2-4 overlap with the RF pulses in the excitation pulse train 500 or the acquisition window 502. The signal intensity of echoes refocusing at the acquisition windows, $S_i$ (i=1, 2, . . . , N), can be numerically simulated without phase encoding gradients using the following parameters: L=4, flip angles $\alpha_1=\alpha_2=\alpha_3=\alpha_4=4°$, RF pulse phases $p_1=p_2=p_3=p_4=0$ radian, $\tau$=3 ms, a single echo acquisition after the RF pulse train, N=500, and $T_1$ and $T_2$ relaxation ($T_1/T_2$=2,000/80 and 1500/100 ms). In numerical simulation, signal decay resulting from diffusion was ignored. As the RF pulse train excitation is applied repeatedly, the refocusing echo signal rises up around the beginning of the sequence, as shown in FIG. 6. As illustrated, once the echo signal reaches its maximum, it gradually descends and reaches the steady-state. Therefore, to avoid disturbance from quickly changing signals around the beginning of the sequence, data acquisition for imaging can start following dummy scans that raise up the refocusing echo signals. Thus, the RF pulse train excitation provides a substantial advantage during clinical imaging in the face of inhomogeneous static magnetic fields due to reduced RF peak power and SAR over other methods, since the sequence does not need explicit refocusing pulses and each pulse in the pulse train has a much lower flip angle ($\alpha_j$) compared to refocusing pulses in spin echo formation.

Image Reconstruction

The MRI signals acquired using the above-described pulse seqeuence, S, and the reconstructed image that can be created from the acquired MRI signals, $\rho$, are expressed by:

$$S=E\rho, \qquad (4); \text{ and}$$

$$\rho=(E^*E)^{-1}E^*S, \qquad (5);$$

where E is an encoding matrix describing evolution of spin magnetization including effects from the inhomogeneous magnetic field and * is complex conjugate transpose. In general, image reconstruction can be performed by calculating the encoding matrix E and then solving Eq. 5. For 3D image reconstruction, E*E is a large matrix. Therefore, $(E^*E)^{-1}$ can be calculated, for example, iteratively with the conjugate gradient algorithm.

Thus, image reconstruction can include any of a variety of cases like monotonic and non-monotonic $B_0$ fields, so long as E*E is a full rank matrix or sufficiently well-conditioned. Notably, Eq. 5 can be solved numerically. Thus, the followings are non-limiting examples of particular cases, which makes image reconstruction easy and simple to solve.

When the phase encoding gradients ($G_{p1}$ and $G_{p2}$) are mutually orthogonal linear gradients and the inhomogeneous $B_0$ field monotonically changes along the readout direction ($G_r$), Eq. 5 can be rewritten as follows:

$$\rho=DF^{-1}S, \qquad (6);$$

in which, $F^{-1}$ and D are the inverse Fourier matrix and the deformation matrix, which compensates for image distortion resulting from nonlinearity of the inhomogeneous static magnetic field and, if applied, the pulsed readout gradient $G_r$. When distribution of the inhomogeneous static magnetic field, $B_0$, is known, the image distortion can be corrected in image reconstruction by calculating D.

When the inhomogeneous $B_0$ field can not be monotonic by applying a readout gradient ($G_r$), more than one isochromats at different spatial locations end up a pile up signal at a single pixel in a reconstructed image, where E*E is ill-conditioned. To solve the signal pile up, multiple data acquisitions are performed with different readout gradients (for example, $G_{r,1}$ and $G_{r,2}$) to make E*E invertible. In this case, S and E in Eq. 4 are expressed as:

$$S = \begin{bmatrix} S_1 \\ S_2 \end{bmatrix} \text{ and } E = \begin{bmatrix} E_1 \\ E_2 \end{bmatrix}, \qquad (7);$$

where the subscripts of S and E (1 and 2) represent the applied readout gradient ($G_{r,1}$ and $G_{r,2}$). When the phase encoding gradients are mutually orthogonal linear gradients, Eq. 6 is represented by:

$$\rho=(P^*P)^{-1}P^*[F^{-1}F^{-1}]S, \qquad (8);$$

in which $P(=[P_1\ P_2])$ is a projection operator that maps from the spatial domain to the frequency domain derived from the inhomogeneous Bo field and the applied readout gradients.

EXAMPLES

The following Examples are provided in order to demonstrate and further illustrate certain embodiments and aspects of the present invention and are not to be construed as limiting the scope of the invention.

Example 1

Brain imaging was conducted for a normal subject with a 4 Tesla MRI system (Agilent technologies inc.). During the MRI scan with the RF pulse train excitation sequence described above, a linear magnetic field gradient was unintermittedly on along the anteroposterior direction to introduce a inhomogeneous static magnetic field. The off resonance frequency resulting from the pseudo-permanet gradient, $\gamma\Delta B_0$, was 200 kHz over the range of 28 cm. The excitation pulse train was composed of 9 streached hyperbolic secant pulses (HS40) with BW=200 kHz and $T_p$=1.25 ms. The RF pulse interval $\tau$ was 3 ms. Flip angles ($\alpha_j$) and RF pulse phases were $\alpha_j$=4° and $p_j$=0 radian, respectively (j=1, 2, ..., 9). Phase encoding gradients were applied along mutually orthogonal 2 directions (along left-right and superior-inferior axes) with constant increments. A pulsed readout gradient was not applied. Other sequence parameters were FOV=28×21×28 cm³, matrix size=256×192×64 and scan time≈7 min. SAR was within the limit in the FDA guideline.

Figure 7:
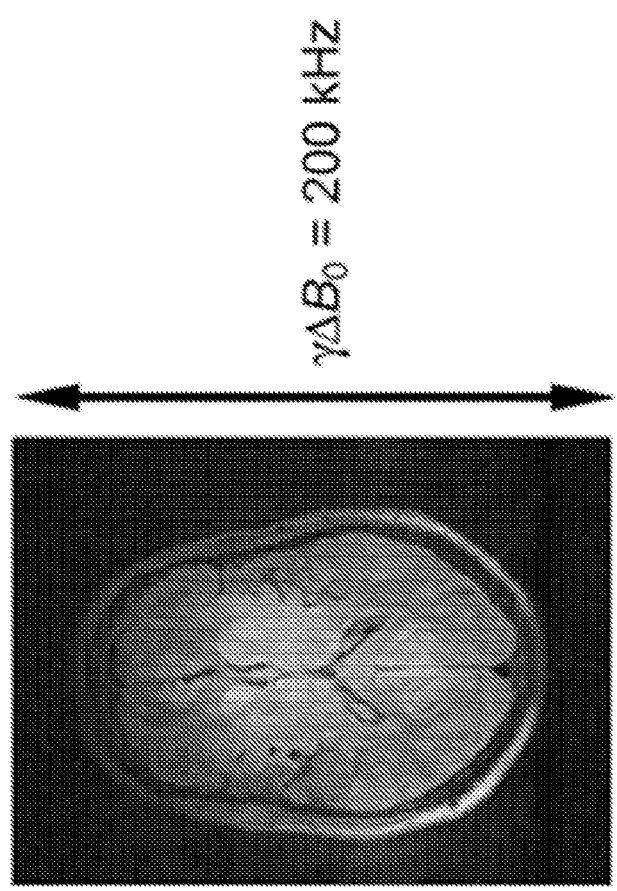
FIG. 7 in vivo human brain image acquired with the RF pulse train excitation sequence of the present disclosure.

In image reconstruction, since the inhomogeneous magnetic field was a linear gradient in space, D in Eq. 6 was assumed to be an identity matrix. Thus, image reconstruction was carried out by appling inverse Fourier transform to the acquired signals, as is done in Cartesian MRI reconstruction. The reconstructed image showed $T_2$ and diffusion weighted contrasts, while any clear artifacts resulting from the applied field inhomogeneity (e.g. image distortion) were not observed, as illustrated in the example image of FIG. 7.

Example 2

In vivo human brain imaging under non-linear inhomogeneous $B_0$ field of 250 kHz off-resonance variation over 20 cm was conducted. The $B_0$ field inhomogeneity was generated by mounting a head gradient coil at 36 cm off the isocenter of a 90-cm 4T magnet. Brain imaging was performed with the RF pulse train sequence described above. Sequence parameters are as follows: $\tau$=2.6 ms, pulse missing is every 6 pulses (L=5, TR=15.6 ms), HS2 pulse excitation with $\alpha_j$=4°, BW=140 kHz and $T_p$=700 μs (corresponding to a time-bandwidth product (TBP)=100), readout bandwidth=180 kHz, cylindrical k-space sampling, and scan time=5.5 min. The permanent $B_0$ field gradients mostly along the z direction were used as spatial encoding (readout) gradients. Pulsed slab-selective and readout gradients, $G_{ss}$ and $G_r$, were applied to mitigate a portion of the $B_0$ inhomogeneity during excitation and acquisition. SAR was within the FDA guideline. A quadrature TEM coil was used for transmit and receive.

When the inhomogeneous $B_0$ field is not linear, the non-uniform field gradient induces image distortion in an image reconstructed with inverse Fourier transform. FIGS. 8A-8D is a series of images showing raw (FIG. 8A), a $B_0$ map (FIG. 8B), and corrected images (FIGS. 8C-8D). The raw image was formed by inverse Fourier transform and the image of FIG. 8C is the distortion corrected image, where deformation matrix D was calculated from the $B_0$ map of FIG. 8B. In the corrected image, signal intensity variation due to image distortion was corrected with Jacobian of the deformation matrix. By providing combined $T_1$, $T_2$, and high diffusion weighting, images with clear delineation of brain anatomy were produced.

Example 3

A non-limiting example of producing a $B_0$ map in the presence of highly inhomogeneous fields produced by mounting a head gradient coil at 36 cm out of the isocenter of a 90-cm 4 T magnet is illustrated. The method acquires refocused echo signals generated by using a pulse sequence with three-dimensional phase-encoding gradients, as is described above. Under the inhomogeneous field, $B_0$ mapping using a cylindrical phantom filled with distilled water and cubic Teflon objects inside was performed with the following sequence parameters: $\tau$=2.4 ms, pulse missing is every 10 pulses (L=9, TR=24 ms), sinc pulse excitation with $\alpha_j$=2°, BW=200 kHz and $T_p$=30 μs (time-bandwidth product TBP=6), readout bandwidth=250 kHz, FOV=20×20×20 cm, matrix size=48×48×64 and scan time=59 min. A quadrature TEM coil was used for transmit and receive.

Phase images from the $B_0$ mapping sequence showed spin isochromats refocusing toward the echo peak and dephasing afterward; where spin phase almost completely refocused at the echo peak. Signals around the top of the phantom faded away during 100-200 μs from the refocusing echo peak due to intra-voxel dephasing (decoherence). The measured $B_0$ map showed 180 kHz frequency variation over the phantom and a quadratically changing field along the z direction.

The proposed method uses refocused echoes generated by the RF pulse train. A similar $B_0$ mapping using chemical shift imaging (CSI) with free induction decay acquisition may be possible. However, under extremely inhomogeneous fields like the setting in this example, CSI-based $B_0$ mapping is also highly challenging. CSI needs at least a few hundred microsecond delay between excitation and data acquisition for pulse phase encoding gradient, which is long enough for signals in steep gradient regions to fade away.

The present disclosure demonstrates image distortion and intensity correction using a measured $B_0$ map. The $B_0$ mapping using the RF pulse train of the present disclosure can measure inhomogeneous $B_0$ fields with an order of hundred KHz off resonance.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Within this specification embodiments have been described in a way which enables a clear and concise specification to be written, but it is intended and will be appreciated that embodiments may be variously combined or separated without parting from the invention. For example, it will be appreciated that all preferred features described herein are applicable to all aspects of the invention described herein.

Thus, while the invention has been described in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein.

Various features and advantages of the invention are set forth in the following claims.

We claim:

1. A method for acquiring magnetic resonance imaging data from a subject, the method including steps comprising:
    (i) performing a series of radio frequency pulses formed of L individual RF pulses ($P_j$; j=1, 2, . . . L) applied with a constant time interval, $\tau$, between each of the L individual RF pulses to form a $B_1$ magnetic field about at least of a region of interest (ROI) in the subject, the L individual RF pulses having a flip angle ($\alpha_j$) that is less than 30 degrees;
    (ii) performing phase encoding gradients to achieve spatial encoding;
    (iii) performing an imaging acquisition process over an acquisition window (Acq) following the phase encoding gradients to acquire imaging data;
    (iv) performing phase encoding rephasing gradients to rewind spins introduced by the phase encoding gradients; and
    (v) repeating steps (i)-(iv) such that a time between a center of the acquisition window (Acq) and a center of a first RF pulse in a first RF pulse in a repetition of (i) is equal to the constant pulse interval ($\tau$); and
    wherein step (ii) includes performing three of the phase encoding gradients and step (iv) includes performing three of the phase encoding rephasing gradients; and
    wherein step (v) is repeated to acquire the 3D imaging data, and a $B_0$ field map is calculated using at least two images and at least two time points.

2. The method of claim 1 wherein a waveform of the individual RF pulses ($P_j$;j=1, 2, . . . L) includes at least one of amplitude-modulated pulses and frequency-modulated pulses.

3. The method of claim 1 wherein each of the individual RF pulses ($P_j$; j=1, 2, . . . L) have at least one of a common waveform and pulse duration (pw).

4. The method of claim 1 wherein each of the individual RF pulses ($P_j$; j=1, 2, . . . L) have at least one of flip angle ($\alpha_j$) and phase ($p_j$) that varies between one of individual RF pulses or repetitions of step (i).

5. The method of claim 1 wherein an excitation bandwidth (BW) of each of the individual RF pulses ($P_j$;j=1, 2, . . . L) is matched to an image acquisition bandwidth in a frequency encoding direction.

6. The method of claim 1 wherein during the acquisition window, a pulsed readout gradient field ($G_r$) is applied along with dephasing ($G_d$) and rephasing ($G_{rp}$) gradients before and after readout gradient ($G_r$).

7. The method of claim 1 wherein step (iii) includes performing a pulsed readout gradient ($G_r$) designed to compensate the inhomogeneous magnetic field ($B_0$).

8. The method of claim 1 wherein step (ii) includes performing a pulsed slab-selective gradient ($G_{ss}$) that is applied to compensate for at least a portion of the inhomogeneous magnetic field ($B_0$).

9. The method of claim 7 wherein pulsed readout gradient ($G_r$) is designed to control against local magnetic field gradients of the inhomogeneous magnetic field ($B_0$) to satisfy $\nabla B_0 \neq 0$ or $B_0(x, y, z_1) \neq B_0(x, y, z_2)$, $(z_1 \neq z_2)$.

10. The method of claim 1 wherein step (v) is repeated to acquire three-dimensional (3D) imaging data.

11. The method of claim 1 wherein the $B_0$ field is used to produce a distortion corrected three-dimensional (3D) imaging data having reduce image distortion.

12. A magnetic resonance imaging (MRI) system comprising:
    a magnet system configured to generate a polarizing magnetic field about at least a region of interest (ROI) of a subject arranged in the MRI system, wherein the polarizing magnetic field is inhomogeneous within the ROI;
    a plurality of gradient coils configured to apply a gradient field to the polarizing magnetic field;
    a radio frequency (RF) system configured to apply an excitation field to the subject and acquire MR image data from the ROI;
    a computer system programmed to control the plurality of gradient coils and the RF system to:
        (i) perform a series of radio frequency pulses formed of L individual RF pulses ($P_j$; j=1, 2, . . . L) applied with a constant time interval, $\tau$, between each of the L individual RF pulses to form a $B_1$ magnetic field about at least of the ROI, the L individual RF pulses having a flip angle ($\alpha_j$) that is less than 30 degrees;
        (ii) perform phase encoding gradients to achieve spatial encoding;
        (iii) perform an imaging acquisition process over an acquisition window (Acq) following the phase encoding gradients to acquire imaging data;
        (iv) perform phase encoding rephasing gradients to rewind spins introduced by the phase encoding gradients;
        (v) repeat steps (i)-(iv) such that a time between a center of the acquisition window (Acq) and a center of a first RF pulse in a first RF pulse in a repetition of (i) is equal to the constant pulse interval ($\tau$);
        (vi) generate images of the ROI that are substantially free of artifacts caused by inhomogeneities of the polarizing magnetic field; and
    wherein the computer system is further programmed to perform a $B_0$ mapping of inhomogeneities of the polarizing magnetic field with the series of radio frequency pulses.

13. The MRI system of claim 12, wherein the polarizing magnetic field has a $B_0$ field inhomogeneity in frequency unit of at least 250 kHz for protons.

* * * * *

UNITED STATES PATENT AND TRADEMARK OFFICE
CERTIFICATE OF CORRECTION

PATENT NO. : 10,591,566 B2
APPLICATION NO. : 16/341677
DATED : March 17, 2020
INVENTOR(S) : Naoharu Kobayashi et al.

Page 1 of 1

It is certified that error appears in the above-identified patent and that said Letters Patent is hereby corrected as shown below:

In the Specification

Column 1, Line 18, "RR027290 by" should be -- RR027290 awarded by --.

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*